(12) United States Patent
Derner et al.

(10) Patent No.: US 10,431,291 B1
(45) Date of Patent: Oct. 1, 2019

(54) SYSTEMS AND METHODS FOR DYNAMIC RANDOM ACCESS MEMORY (DRAM) CELL VOLTAGE BOOSTING

(71) Applicant: Micron Technology, Inc., Boise, ID (US)

(72) Inventors: Scott J. Derner, Boise, ID (US); Tae H. Kim, Boise, ID (US); Charles L. Ingalls, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/058,600

(22) Filed: Aug. 8, 2018

(51) Int. Cl.
G11C 11/4074 (2006.01)
G11C 11/408 (2006.01)
G11C 11/4091 (2006.01)

(52) U.S. Cl.
CPC ...... *G11C 11/4074* (2013.01); *G11C 11/4085* (2013.01); *G11C 11/4091* (2013.01)

(58) Field of Classification Search
CPC ................................ G11C 8/12; G11C 11/404
USPC ............................................ 365/150, 230.03
See application file for complete search history.

(56) References Cited

U.S. PATENT DOCUMENTS

| 5,650,672 | A | * | 7/1997 | Curd | H03K 17/04163 |
| | | | | | 307/130 |
| 5,687,108 | A | * | 11/1997 | Proebsting | G11C 5/14 |
| | | | | | 365/226 |
| 5,896,320 | A | * | 4/1999 | Taguchi | G11C 5/14 |
| | | | | | 327/57 |
| 5,966,340 | A | * | 10/1999 | Fujino | G11C 8/14 |
| | | | | | 365/230.03 |
| 6,195,306 | B1 | * | 2/2001 | Horiguchi | G11C 5/063 |
| | | | | | 365/226 |
| 6,285,611 | B1 | * | 9/2001 | Kang | G11C 7/065 |
| | | | | | 365/205 |
| 6,373,753 | B1 | * | 4/2002 | Proebsting | G11C 5/145 |
| | | | | | 257/E21.659 |
| 6,462,998 | B1 | * | 10/2002 | Proebsting | G11C 7/04 |
| | | | | | 257/E21.659 |
| 6,847,566 | B1 | * | 1/2005 | Han | G11C 7/06 |
| | | | | | 365/203 |
| 9,299,414 | B1 | * | 3/2016 | Lin | G11C 11/40615 |
| 9,620,197 | B1 | * | 4/2017 | Park | G11C 11/40618 |
| 2002/0186581 | A1 | * | 12/2002 | Yamaoka | G11C 11/412 |
| | | | | | 365/154 |
| 2003/0002333 | A1 | * | 1/2003 | Hidaka | G11C 11/15 |
| | | | | | 365/171 |
| 2003/0151964 | A1 | * | 8/2003 | Takahashi | G11C 8/18 |
| | | | | | 365/204 |

(Continued)

*Primary Examiner* — Michael T Tran
(74) *Attorney, Agent, or Firm* — Fletcher Yoder, P.C.

(57) ABSTRACT

A memory device is provided. The memory device includes a memory array having at least one memory cell. The memory device further includes a sense amplifier circuit configured to read data from the at least one memory cell, write data to the at least one memory cell, or a combination thereof. The memory device additionally includes a first bus configured to provide a first electric power to the sense amplifier circuit, and a second bus configured to provide a second electric power to a second circuit, wherein the first bus and the second bus are configured to be electrically coupled to each other to provide for the first electric power and the second electric power to the at least one memory cell.

13 Claims, 6 Drawing Sheets

(56) References Cited

U.S. PATENT DOCUMENTS

| | | | |
|---|---|---|---|
| 2004/0027907 A1* | 2/2004 | Ooishi | G11C 11/15 365/226 |
| 2006/0069851 A1* | 3/2006 | Chung | G06F 11/1004 711/103 |
| 2008/0048767 A1* | 2/2008 | Kobayashi | G11C 5/147 327/538 |
| 2008/0165593 A1* | 7/2008 | Lee | G11C 7/08 365/189.09 |
| 2009/0135663 A1* | 5/2009 | van Winkelhoff | G11C 7/12 365/189.16 |
| 2010/0226170 A1* | 9/2010 | Lin | G11C 5/141 365/185.03 |
| 2010/0246297 A1* | 9/2010 | Zhang | G11C 5/147 365/200 |
| 2013/0016573 A1* | 1/2013 | Goel | G11C 7/02 365/189.06 |
| 2013/0082404 A1* | 4/2013 | Kajigaya | H01L 23/498 257/777 |
| 2014/0211547 A1* | 7/2014 | Kapre | G11C 5/14 365/154 |
| 2016/0086648 A1* | 3/2016 | Dol | G11C 11/2257 365/145 |
| 2016/0125919 A1* | 5/2016 | Hush | G11C 7/065 365/205 |
| 2017/0374308 A1* | 12/2017 | Hwang | H04N 5/3577 |
| 2019/0065082 A1* | 2/2019 | Penney | G06F 3/0622 |

* cited by examiner

SYSTEMS AND METHODS FOR DYNAMIC RANDOM ACCESS MEMORY (DRAM) CELL VOLTAGE BOOSTING

BACKGROUND

Field of the Present Disclosure

The present disclosure relates to dynamic random access memory (DRAM), and more specifically, to systems and methods for boosting voltage in certain DRAM cells.

Description of Related Art

Certain read/write memory devices, such as dynamic random access memory (DRAM), include arrays having memory cells that store information. For example, certain DRAM devices, such as synchronous dynamic RAM (SDRAM) devices may have multiple memory banks having many addressable memory elements or cells included in memory arrays. In use, the SDRAM devices may receive data input signals at high speeds, such as speeds of 1 gigabits per second (Gbps) or more, and store data in the memory cells based on the data input signals. The memory cells may then be accessible to external systems and may be used to retrieve the data stored therein, for example, by providing for an address of one or more of the memory cells. It would be beneficial to improve the writing of certain data into the memory cells.

Embodiments of the present disclosure may be directed to one or more of the problems set forth above.

BRIEF DESCRIPTION OF THE DRAWINGS

Various aspects of this disclosure may better be understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Many electrical devices may include random access memory (RAM) devices coupled to processing circuitry, and the memory devices may provide storage for data processing. Examples of RAM devices include dynamic RAM (DRAM) devices and synchronous DRAM (SDRAM) devices, which may store individual bits electronically. The stored bits may be organized into addressable memory elements (e.g., words), which may be stored in memory banks. To receive and to transmit the bits, the RAM devices may include certain data communications circuitry as well as communication lines, e.g., wordlines, useful in saving and retrieving the bits from the memory bank. In certain DRAM and SDRAM devices, close timing may cause wordlines connecting a row of cells to shut off before full cell voltage is restored (e.g., restored to voltage common collector [Vcc] voltage) for logical high (e.g., 1's) data.

The shutting off of a wordline may typically be a worst case scenario for memory cells located close to a wordline driver circuit, as the wordline may shut off faster at locations proximal to the wordline driver circuit. To help alleviate this issue, the embodiments further described herein may boost a sense amplifier (SA) power supply bus (ACT) to a higher voltage as the wordline is disabled via modification of certain wordline drives, such as global wordline drivers. The modification then enables the cell voltage to reach a higher level prior to the wordline shutting off, which may improve the 1's data signal on the next access cycle. No additional power supplies are added to enable the techniques described herein. Instead, a row driver signal/bus PH is shorted to ACT to accomplish the ACT voltage level boost while also reducing the PH voltage signal level and the proper time during the normal wordline off sequence.

Figure 1:
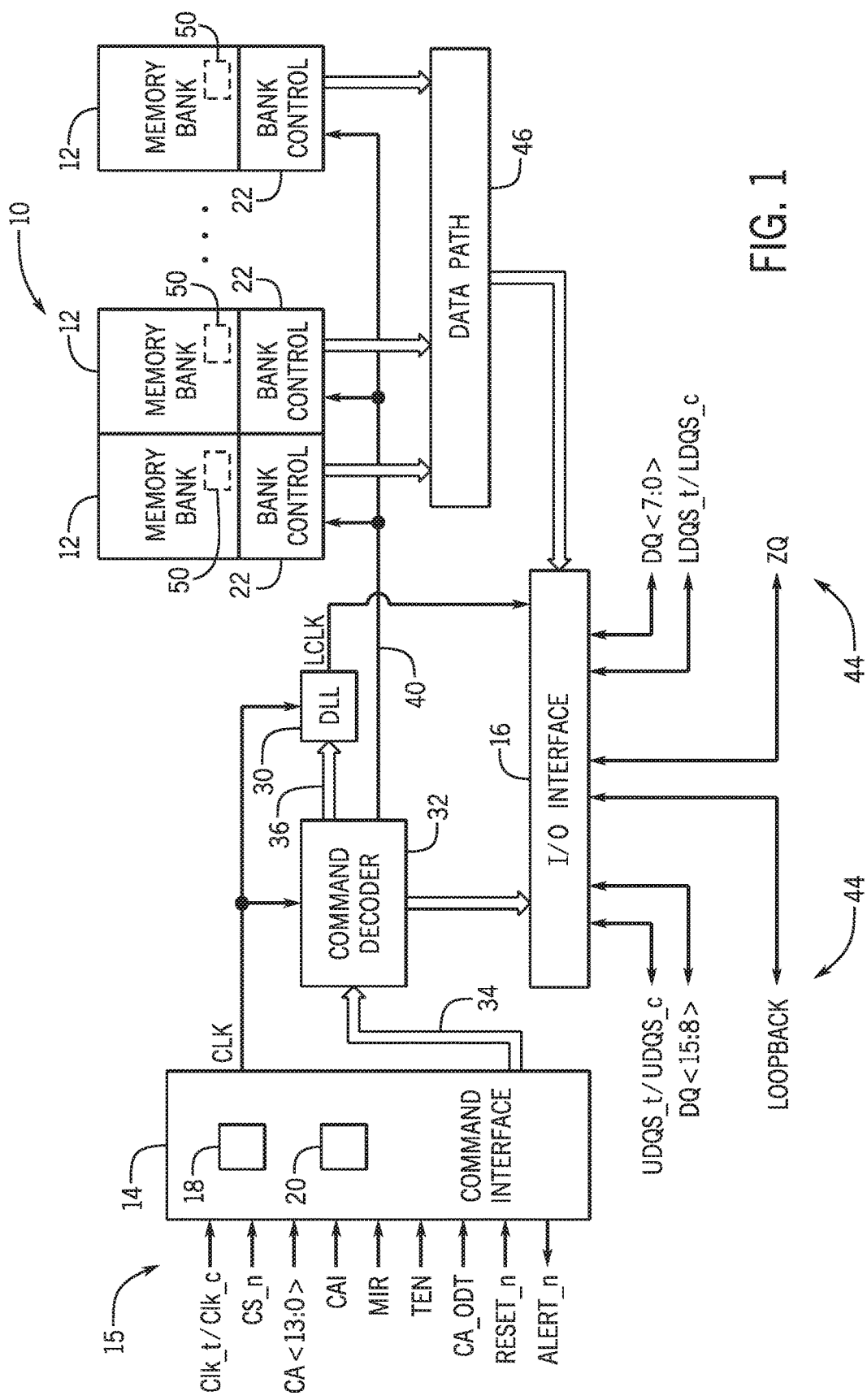
FIG. 1 is a block diagram illustrating an organization of a memory device that may include a memory cell voltage boost system disposed in memory bank, in accordance with an embodiment.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM as further described herein allow for reduced power consumption, more bandwidth, and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the complementary clock signal (Clk_c). The positive clock edge for DDR refers to the point where the rising true clock signal Clk_t/ crosses the falling complementary clock signal Clk_c, while the negative clock edge indicates that transition of the falling true clock signal Clk_t and the rising of the complementary clock signal Clk_c. Commands (e.g., read command, write command (WrCmd), etc.) are typically entered on the positive edges of the clock signal and data is transmitted or received on both the positive and negative clock edges.

The clock input circuit 18 receives the true clock signal (Clk_t/) and the complementary clock signal (Clk_c) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0<). The command/address signals are clocked to the command interface 14 using the clock signals (Clk_t/ and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data for read and write commands may be sent to and from the memory device 10, utilizing the command and clocking signals discussed above, by transmitting and receiving data signals 44 through the IO interface 16. More specifically, the data may be sent to or retrieved from the memory banks 12 over the data path 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

The data (e.g., IO signals) for read and writes may be addressed to certain memory (e.g., memory cells) in the memory banks 12. The techniques described herein provide for a cell voltage boost of 1's data during wordline off time, which may not sacrifice row precharge time (tRP) timing performance. Accordingly, a memory cell voltage boost system 50 may process the 1's data, for example, by connecting certain signals to existing power supply buses prior to initiating the wordline off sequence as further described in the figures below. By boosting the cell voltage of 1's data, the techniques described herein may help 1's data margin during cases where write recovery time (tWR), which includes an amount of cycles that are required after a valid write operation and precharge, is small. Accordingly, writes of 1's data may be improved in tight tWR situations.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/ VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory system 10. Accordingly, it should be understood that the block diagram of FIG. 1 is only provided to highlight certain functional features of the memory device 10 to aid in the subsequent detailed description. For example, the memory cell voltage boost system 50 or certain circuitry of the memory cell voltage boost system 50 may be disposed as part of one memory bank 12 or all memory banks 12, or combinations thereof.

Figure 2:
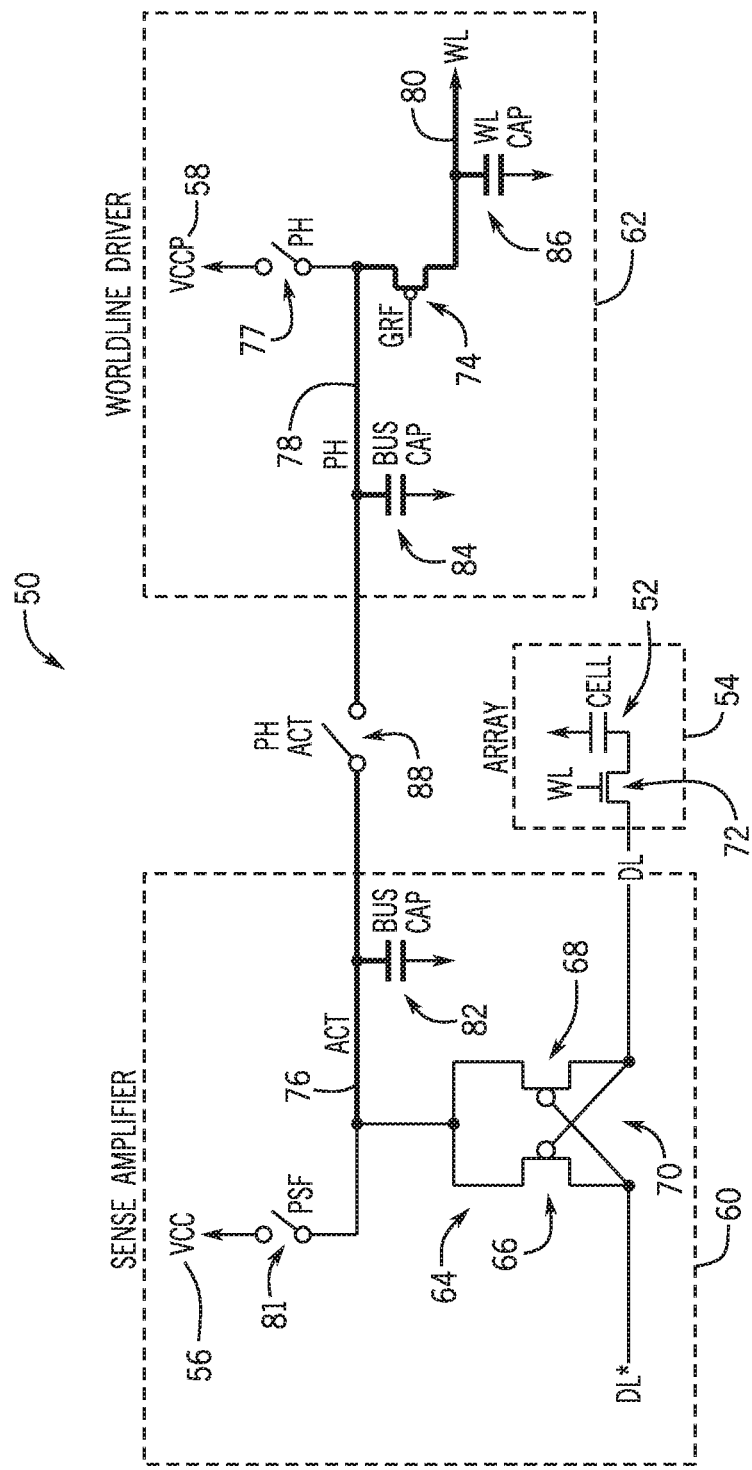
FIG. 2 is a circuit diagram of the memory cell voltage boost system of FIG. 1, in accordance with an embodiment.

It would be beneficial to illustrate an embodiment of a memory cell voltage boost system 50. Accordingly, FIG. 2 depicts an embodiment of a simplified memory cell voltage boost system 50 which may be operatively coupled to one or more memory cells (e.g., capacitors) 52 included in a memory array 54 of the memory bank 12. It is to be understood that the depicted embodiment is a simplified example only, useful for illustration, and that other cell voltage boost systems 50 may include more or less components and/or connections. In the depicted embodiment, VCC power supply 56 may typically provide between 0.5 to 1.5 volts DC, such as 1 volt DC during operations, while VCCP power supply 58 may typically provide a higher voltage, e.g., between 2 to 5 volts DC, such as 3 volts DC during operations. The VCC power supply 56 is used to power a sense amplifier system 60, while the VCCP power supply 56 is used to power a wordline driver system 62.

The sense amplifier circuit may read and write (e.g., refresh) data in the memory cell(s) 52, for example via digitlines (e.g., column lines in the array 54) while the wordline driver system 62 may raise or lower voltages (e.g., VCCP voltages) to one or more row lines of the array 54. In the depicted embodiment, the sense amplifier system 60 may include the cross-coupled P-sense amplification circuit 64. The P-sense amplification circuit 64 may include one or more P-type devices 66, 68, coupled via a cross junction 70. The P-sense amplification circuit 64 may then be coupled to the one or more memory cell(s) 52 via one or more N-type devices 72. The N-type device(s) 72 may then be operated to gate voltage into the memory cell(s) 52.

The wordline driver system 62 may also include one or more wordline "on" control signal (GRF) P-type devices 74, useful in turning on a wordline of the array 54. Accordingly VCCP 58 voltage would flow through switch 77. Also shown are a VCC power supply bus (ACT) 76, a wordline power supply bus (PH) 78, and a wordline 80. Each bus 76, 78, and wordline 80 may include certain inherent capacitance values, represented in the figure via capacitors 82, 84, and 86, respectively. That is, because of their length, included components, connected components, and so on, the 76, 78, and wordline 80 may be disconnected from power and still carry a charge.

Traditionally, the memory cell(s) 52 may be "imprinted" via the VCC 56 voltage to denote a 1's data. The techniques described herein, however, provide for using VCCP 58 voltage use when storing 1's data in the memory cell(s) 52. For example, prior to the techniques described herein, the cross-coupled P-sense amplification circuit 64 may have delivered VCC 56 voltage into the memory cell(s) 54 via switch 81. For example, a previous process executable via the bank controller (s) 22 and used to write to the memory cell(s) 52 may have included first receiving a precharge (PRE) command (e.g., digitline precharge) and then shutting of the wordline driver 62. The memory cell(s) 52 1's data voltage may then set to VCC 56 or lower, depending on the amount of tWR time that it's been given. The cross-coupled P-sense amplification circuit 64 may then be turned off, leaving the 1's data at VCC 56 or lower. However, it would be beneficial to improve 1's data by having higher voltages.

The techniques described herein provide for an improved process that may result in higher voltages for 1's data in the memory cell(s) 52. In one example, once the PRE command is received, the improved process may then charge the memory cell(s) 52 by sharing the PH bus 78 with the ACT bus 76 via a switch 88 and then turning off the wordline 80, as further described below. The cross-coupled P-sense amplification circuit 64 may then be turned off. By charging via the PH bus 78 and the ACT bus 76, the memory cell(s) 52 may have a voltage that is higher (e.g., VCCP 58 voltage), thus improving memory retention and/or memory reads of 1's data.

Figure 3:
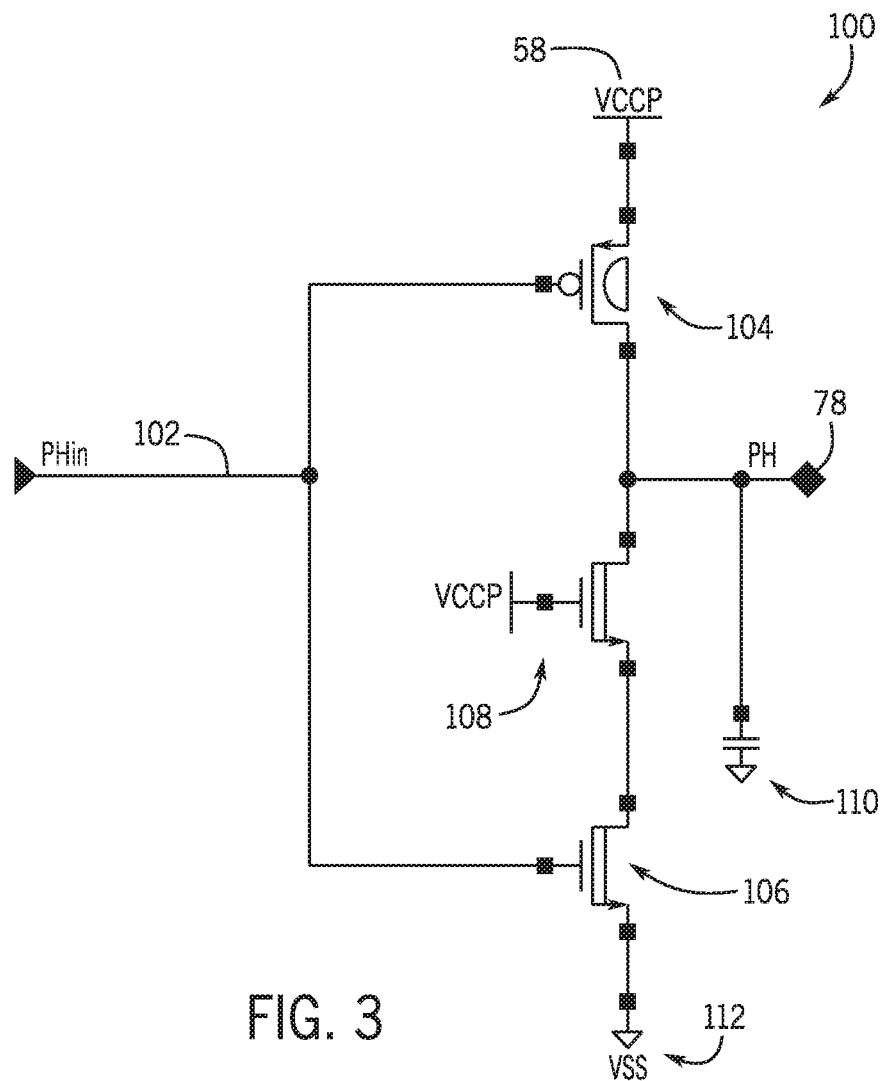
FIG. 3 is a circuit diagram depicting a global wordline driver circuit having a single input signal, in accordance with an embodiment.

Turning now to FIG. 3, the figure is a circuit diagram illustrating an embodiment of a global wordline driver circuit 100 that may be driven by a single signal, PHin 102. In the depicted embodiment, the PHin 102 signal is coupled to P-type devices 104, 106, so that VCCP 58 voltage incoming via P-type device 108 is delivered to the PH bus 78. A capacitor 110 and ground (e.g., VSS) 112 is also shown.

That is, as a precharge (PRE) signal is received, the wordline (e.g., wordline 80) may be turned off. For example, the PHin 102 signal may be taken high to reduce the PH bus 78 voltage from VCCP 59 down to ground, e.g., VSS 112. The PHin 102 signal may also be taken high to "pull" the wordline (e.g., wordline 80) off to a negative wordline voltage (VNWL). A wordline "on" control (GRF) signal may then be taken high (shown in FIG. 2, connected via P-type device 74) to complete the wordline off sequence. The 1's data in the memory cell(s) 52 are then typically VCC or lower, depending on an amount of tWR used. The sense amplification circuit 60 may then be turned off, e.g., by disconnecting a row N-sense-amp latch (RNL) from ground and disconnect the ACT bus 76 from VCC 56.

Figure 4:
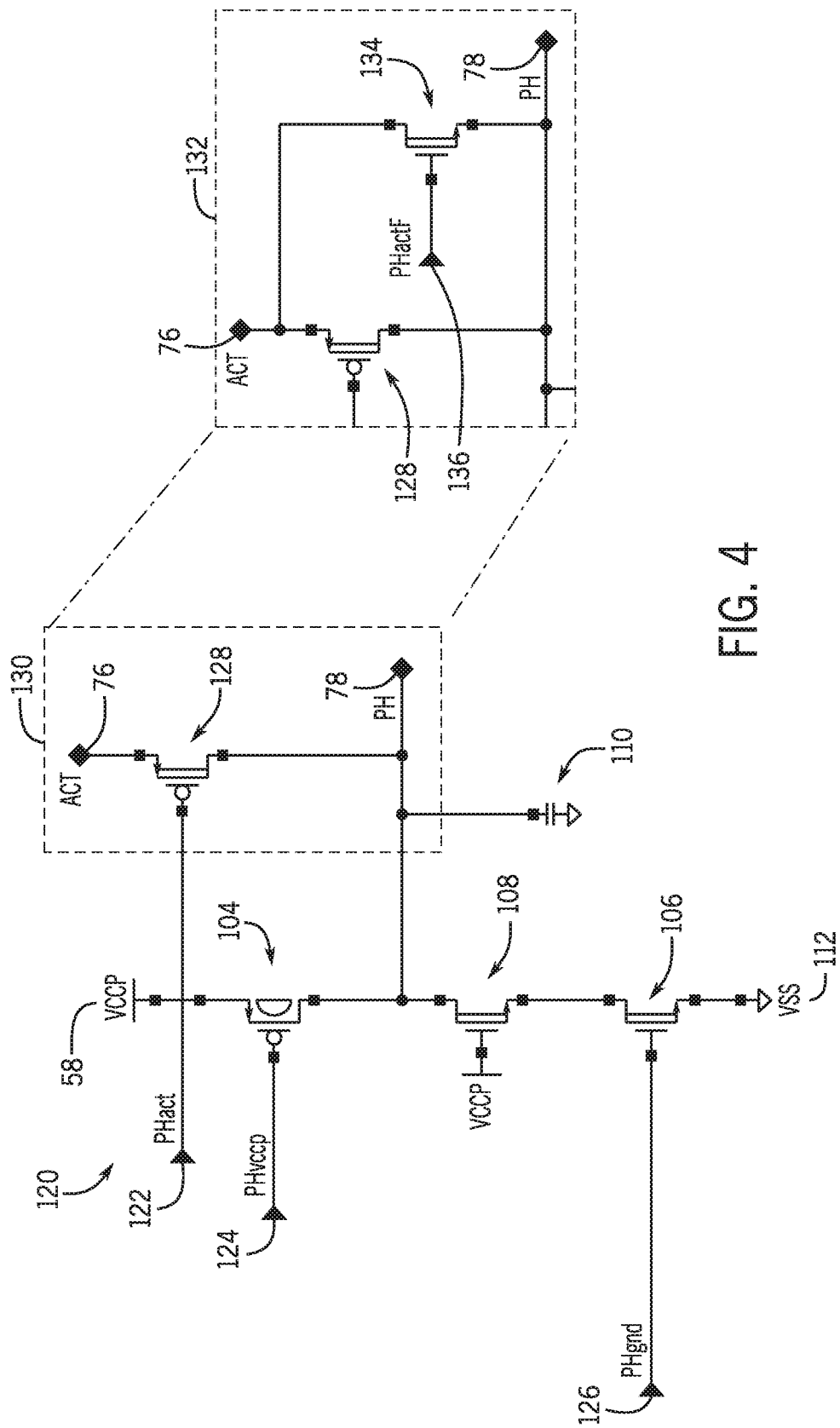
FIG. 4 is a circuit diagram depicting a global wordline driver circuit that may be included in the memory cell voltage boost system of FIG. 2, in accordance with an embodiment.

However, as mentioned earlier, it may be beneficial to improve memory cell(s) 52 1's data by increasing a voltage provided to the memory cell(s) 52. Accordingly, FIG. 4 illustrates an embodiment of a modified global wordline circuit 120 that may use three separate signals PHact, 122, PHvccp 124, and PHgnd 126, suitable for providing increased voltages to the memory cell(s) 52 via the PH bus 78 and the ACT bus 76. In the depicted embodiment, the P-type devices from the global wordline driver circuit 100 may be modified by adding a P-type device 128. Indeed, by adding a single new component 128 and by modifying certain lines to receive the signals PHact, 122, PHvccp 124, and PHgnd 126, the global wordline circuit 100 may be converted into the global wordline circuit 120.

The global wordline circuit 120 may, upon a receipt of the PRE command, charge share the PH bus 78 with ACT bus 76 and turn off the wordline. To charge with the PH bus 78 and the ACT bus 76, a PSA signal controlling switch 81 of FIG. 2 may be disabled to disconnect the ACT bus 76 from VCC 56 so the ACT bus 76 is "floating" with VCC 56 voltage stored on its intrinsic bus capacitor, e.g., shown as element 82 of FIG. 2. The PHvccp signal 124 may then be disabled within the global wordline circuit 120 to allow the PH bus 78 to also "float" with VCCP 56 voltage stored on its intrinsic bus capacitor, shown as element 84 of FIG. 2. The PHact signal 122 may then be enabled within the global wordline circuit 120 to connect the PH bus 78 to the ACT bus 76, effectively charge sharing the two buses 76, 78. Sharing the two buses 76, 78 "pulls" the ACT bus 76 voltage higher than VCC 56 voltage to aid in boosting the write voltage of 1's data, while still "pulling" the PH bus 78 as low as is desired during the wordline off sequence. The PHact signal 122 may then be disabled after charge sharing has occurred to separate the ACT bus 76 from the PH bus 78. The PHgnd signal 126 within the PH driver circuit may then be taken high to reduce the PH bus 78 voltage from VCCP 56 down to ground. A GRF signal used to actuate, for example, the P-type device 74 of FIG. 2, may then be taken high after PH voltage is taken low to complete the wordline off sequence. The 1's data cell 52 voltage may now be higher than using VCC 56 voltage. The sense amplifier circuit 60 may then be turned off, e.g., by disconnecting RNL from ground.

Also shown in FIG. 4 is a circuit section or portion 130. In some embodiments, the circuit section 130 may be replaced with the illustrate circuit section or portion 132. Circuit section 132 includes an extra device, e.g., a N-type device 134, which may aid in connecting the ACT bus 76 to the PH bus 78, which may further increase performance, e.g., increase voltage stored in the memory cell(s) 52. A signal PHactF 136 may then be used to gate the N-type device 134, which may be based on the PHact signal 122. By providing for electrical sharing between the ACT bus 76 and the PH bus 78, the global wordline circuit 120 may improve memory cell 52 writes, even in situations with "tight" tWR timing, as shown below with respect to FIG. 5.

Figure 5:
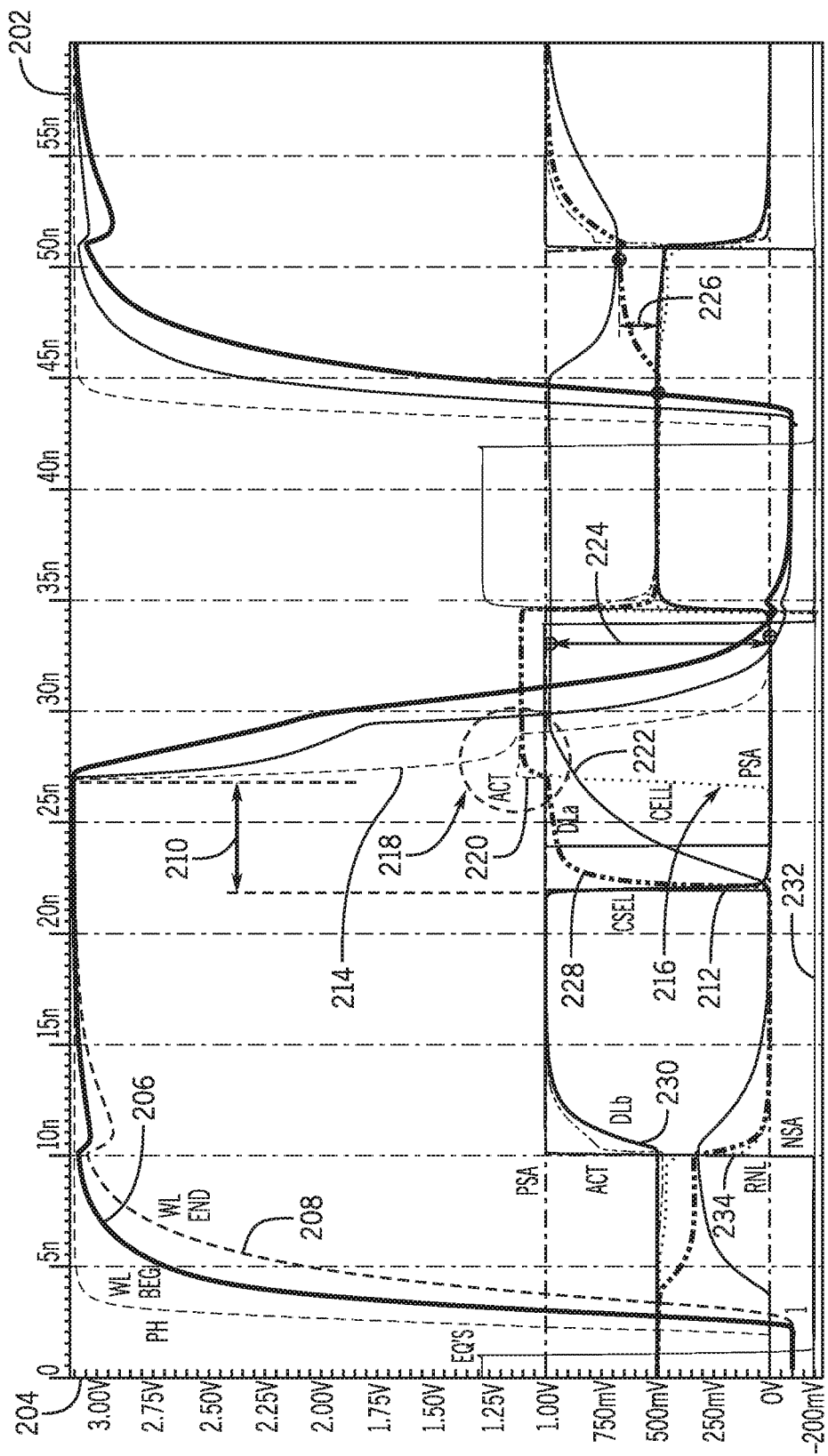
FIG. 5 is a timing diagram depicting memory cell voltage boosting, in accordance with an embodiment.

FIG. 5 illustrates a timing diagram 200 of an embodiment of a series of signals that show an example tWR timing that may be still suitable for writing valid data, e.g., 1's data, into the memory cell(s) 52. In the depicted embodiment, an X-axis 202 measures time, while a Y-axis 204 measures voltage. Wordline begin signal 206 may be followed by wordline end signal 208 to denote beginning and ending of the wordline 80 actuation. As shown a tWR timing 210 may be found between a column select enable (CSEL) signal 212 going high and a PH signal 214 (e.g., PH bus 78 voltage) being brought low. The techniques described herein disable the PSA switch 81 (shown in FIG. 2) which may be disabled based on a PSA signal 216 (shown inside of the tWR timing 210) to allow for the shared bus boost (e.g., sharing of ACT bus 76 and PH bus 78). In the depicted embodiment, the PSA signal 216 may be raised very close to the end of the tWR timing 210, e.g., 1 nanosecond or less, to enable the shared bus boost.

Area 218 of the timing diagram 200 shows ACT signal 220 and PH signal 214 as manipulated via the P-type and N-type devices included in the global wordline circuit 120 when the ACT bus 76 and the PH bus 78 are shared. As mentioned earlier, sharing the ACT bus 76 and the PH bus 78 may then provide for a higher 1's data voltage for the memory cell(s) 52. Indeed, cell voltage 222 is shown as time 224 as being 98% of VCC 56 voltage. Additionally, cell voltage 222 at time 226 may have retain its boost (e.g., boost via sharing the ACT bus 76 and the PH bus 78) to be 9% higher when compared to a non-boost approach. For completeness, an active digitline (e.g., digitline in the same array section with the active wordline) signal (DLa) 228, a reference digitline (e.g., digitline in the same array section with all active wordlines off) signal (DLb) 230, and N-sense amplifier enable (NSA) signal 232 are shown. The NSA signal 232 may enable the RNL bus voltage 234. By boosting the memory cell(s) 52 voltage, e.g., via the sharing of NSA and PH buses 76, 78, the techniques described herein may improve 1's data storage in the memory cell(s) 52.

Figure 6:
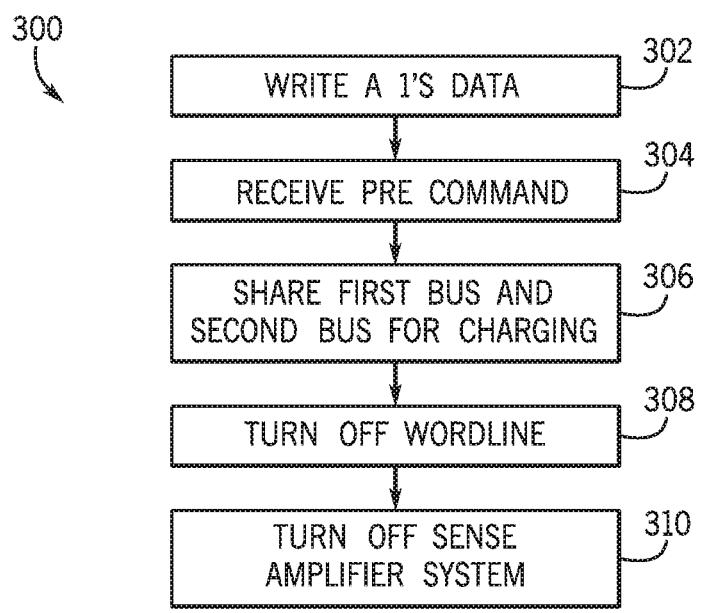
FIG. 6 is a flow chart of a process suitable for memory cell voltage boosting, in accordance with an embodiment.

FIG. 6 is flowchart illustrating an embodiment of a process 300 suitable for boosting memory cell 52 1's data voltage levels. The process 300 may be implemented as circuitry, computer code, or combination thereof, executable by the memory bank control 22, the memory cell voltage boost system 50, and/or the global wordline circuit 120. In the depicted embodiment, the process 300 may be in the process of writing (block 302) a data "1" to the memory cell 52 under possibly a "tight" tWR condition, such as a tWR timing 210 that may be, for example, 10 nanoseconds or less. During the writing (block 302), the sense amplifier circuit 60 may be latched. That is, the ACT bus 76 may be connected to VCC 56 and the RNL bus may be connected to ground, with a digitline held high to VCC 56 voltage. During the writing (block 302) the wordline (e.g., wordline 80) is enabled, but the memory cell 52 voltage may still possibly be trying to complete its transition to a full VCC 56 level, which may ultimately be determined by the tWR time that the memory cell 52 is given.

The process 300 may then receive the precharge (PRE) command (block 304), for example to "close" a row. Following the PRE command, the process 300 may then share a first and a second bus for boosted charging of the memory cell 52. For example, the ACT bus 76 and the PH bus 78 may be shared. To charge with the PH bus 78 and the ACT bus 76, the PSA signal 216 may be controlling the switch 81 of FIG. 2 to disconnect the ACT bus 76 from VCC 56 so the ACT bus 76 is "floating" with VCC 56 voltage stored on its intrinsic bus cap, e.g., shown as element 82 of FIG. 2. The PHvccp signal 124 may then be disabled within the global wordline circuit 120 to allow the PH bus 78 to also "float" with VCCP 56 voltage stored on its intrinsic bus cap, shown as element 84 of FIG. 2. The PHact signal 122 may then be enabled within the global wordline circuit 120 to connect the PH bus 78 to the ACT bus 76, effectively charge sharing the two buses 76, 78. Sharing the two buses 76, 78 "pulls" the ACT bus 76 voltage higher than VCC 56 voltage to aid in boosting the write voltage of 1's data, while still "pulling" the PH bus 78 as low as is desired during the wordline off sequence. The PHact signal 122 may then be disabled after charge sharing has occurred to separate the ACT bus 76 from the PH bus 78. The PHgnd signal 126 within the PH driver circuit may then be taken high to reduce the PH bus 78 voltage from VCCP 56 down to ground.

The process 300 may then turn of the wordline (block 306). For example, a GRF signal used to actuate the P-type device 74 of FIG. 2, may then be taken high after PH voltage is taken low to complete the wordline off sequence. The sense amplifier circuit 60 may then be turned off (block 308), e.g., by disconnecting RNL from ground. The 1's data cell 52 voltage may now be higher than using VCC 56 voltage, as shown at times 224, 226 of FIG. 5.

While the embodiments described herein may be susceptible to various modifications and alternative forms, specific embodiments have been shown by way of example in the drawings and have been described in detail herein. However, it should be understood that the disclosure is not intended to be limited to the particular forms disclosed. Rather, the disclosure is to cover all modifications, equivalents, and alternatives falling within the spirit and scope of the techniques and system described in the disclosure as defined by the following appended claims.

What is claimed is:

1. A memory device, comprising:
   a memory array having at least one memory cell;
   a sense amplifier circuit configured to read data from the at least one memory cell, write data to the at least one memory cell, or a combination thereof;
   a first bus configured to provide a first electric power to the sense amplifier circuit; and
   a second bus configured to provide a second electric power to a second circuit, wherein the first bus and the second bus are configured to be electrically coupled to each other to provide for the first electric power and the second electric power to the at least one memory cell, wherein the first bus is electrically coupled to a first power supply, wherein the second bus is electrically coupled to a second power supply, and wherein the second power supply is configured to deliver a voltage higher than the first power supply.

2. The memory device of claim 1, wherein the first electric power comprises a first inherent capacitance power of the first bus, wherein the second electric power comprises a second inherent capacitance power of the second bus, or a combination thereof.

3. The memory device of claim 1, wherein the second circuit comprises a wordline driver circuit configured to provide the second electric power to a wordline of the memory array, and wherein the wordline is electrically coupled to the at least one memory cell.

4. The memory device of claim 1, wherein the sense amplifier circuit comprises a P-sense amplification circuit having one or more P-type devices coupled via a cross-junction, wherein the P-sense amplification circuit is electrically coupled to the at least one memory cell.

5. The memory device of claim 1, wherein the first power supply comprises a VCC power supply delivering between 0.5 to 1.5 volts DC and wherein the second power supply comprises a VCCP power supply delivering between 2 to 5 volts DC.

6. The memory device of claim 1, comprising a global wordline circuit, wherein the global wordline circuit is configured to electrically couple the first bus with the second bus after receipt of a precharge (PRE) command to provide for the first electric power and the second electric power to the at least one memory cell.

7. The memory device of claim 6, wherein the global wordline circuit is configured to disconnect the first bus from a first power supply, disconnect the second bus from a second power supply, and subsequently to electrically couple the first bus with the second bus.

8. The memory device of claim 7, wherein the global wordline circuit comprises a P-type device electrically coupling the first bus to the second bus and wherein the global wordline circuit is configured to electrically couple the first bus with the second bus via actuation of the P-type device.

9. A method for charging a memory cell included in a memory array, comprising:
   receiving a precharge (PRE) command;
   electrically coupling a first bus to a second bus;
   charging the memory cell via a first electric power provided by the first bus and via a second electric power provided by the second bus;
   turning off a wordline included in the memory array, wherein the wordline is electrically coupled to the memory cell; and
   writing a 1's data into the memory cell prior to receiving the PRE command.

10. The method of claim 9, wherein the first electric power comprises a first inherent capacitance power of the first bus, wherein the second electric power comprises a second inherent capacitance power of the second bus, or a combination thereof.

11. The method of claim 9, wherein writing the 1's data into the memory cell comprises using a sense amplifier circuit to write the 1's data.

12. The method of claim 11, comprising turning off the sense amplifier circuit after turning off the wordline.

13. The method of claim 9, wherein electrically coupling the first bus to the second bus comprises actuating a single P-type device included in a global wordline circuit to electrically couple the first bus to the second bus.

* * * * *